United States Patent [19]

Sago et al.

[11] Patent Number: 4,908,653
[45] Date of Patent: Mar. 13, 1990

[54] EXPOSURE SYSTEM FOR IMAGE RECORDING APPARATUS

[75] Inventors: Akira Sago; Masashi Ueda; Osamu Takagi, all of Nagoya; Yumio Matsumoto, Kasugai; Kiyoharu Hayakawa, Ama, all of Japan

[73] Assignee: Brother Kogyo Kabushiki Kaisha, Japan

[21] Appl. No.: 204,239

[22] Filed: Jun. 9, 1988

[30] Foreign Application Priority Data

Jun. 10, 1987 [JP] Japan .................................. 62-89132
Jun. 15, 1987 [JP] Japan .................................. 62-91498

[51] Int. Cl.$^4$ ........................ G03B 27/32; G03B 17/00
[52] U.S. Cl. ......................................... 355/27; 354/202
[58] Field of Search ...................... 355/27, 28, 29, 78, 355/84, 99, 113; 354/202 FF

[56] References Cited

U.S. PATENT DOCUMENTS

| 2,853,921 | 9/1958 | Biedermann et al. | 354/202 X |
| 2,855,834 | 10/1958 | Doster | 355/29 |
| 4,349,257 | 9/1982 | Friedman et al. | 354/202 X |
| 4,399,209 | 8/1983 | Sanders et al. | 430/138 |

Primary Examiner—Donald A. Griffin
Attorney, Agent, or Firm—Oliff & Berridge

[57] ABSTRACT

An exposure system for use in an image recording apparatus includes a photosensitive and pressure-sensitive recording sheet which is sensitive to light in a certain wavelength range. The exposure system also includes a light source disposed on one side of the photosensitive and pressure-sensitive recording medium for applying the light in the predetermined wavelength range to the photosensitive and pressure-sensitive recording medium through a first original, and a space region disposed on said one side for accommodating therein an optional exposure unit for optionally exposing the photosensitive and pressure-sensitive recording medium through a second original. The light source is movable while applying the light to the photosensitive and pressure-sensitive recording medium through the first original. The exposure system also includes a rest area for resting the light source out of a light path along which the optional exposure unit exposes the photosensitive and pressure-sensitive recording medium through the second original.

7 Claims, 2 Drawing Sheets

EXPOSURE SYSTEM FOR IMAGE RECORDING APPARATUS

BACKGROUND OF THE INVENTION

The present invention relates to an exposure system incorporated in an image recording apparatus for recording and reproducing an image of an original. The exposure system exposes a photosensitive recording medium to light representing the image of the original.

Conventional exposure systems in such an image recording apparatus includes a light source for exposing an original to light and a photosensitive recording medium for sensing light reflected from the original. The light source and the photosensitive recording medium are disposed below an original table or holder which supports the original thereon. The exposure system also includes an optional exposure unit disposed above the original holder. The exposure system is selectively operable as a reflection-type exposure system and a transmission-type exposure system. When operating as the reflection-type exposure system, the photosensitive recording medium is exposed to light reflected from the original. When used as the transmission-type exposure system, light emitted from the optional exposure unit is transmitted through the original and applied to the photosensitive recording medium. Since the optional exposure unit is disposed above the original holder, it is necessary that an installation space be provided above the original holder for accommodating the optional exposure unit therein. Therefore, the entire exposure system is large in size as the optional exposure unit and the light source are respectively located above and below the original holder.

In another type of the exposure system, a light source unit housing a light source is fixedly installed above an original holder in a position confronting a central area, or rightmost or leftmost portion, of the original holder for downwardly irradiating light onto an original supported on the original holder. Where the light source unit is fixedly positioned above the original holder in confronting relation to the central area of the original holder, an optional exposure unit cannot be installed above the original holder because of the presence of the fixed light source unit.

SUMMARY OF THE INVENTION

In view of the aforesaid shortcomings of the conventional exposure systems, it is an object of the present invention to provide an exposure system in which a space is provided in a lower portion of an original holder for accommodating therein a light source and an optional exposure unit, and a common light path is shared by the light source and the optional exposure unit.

Another object of the present invention is to provide an exposure system including a movable light source which, when not used to apply light to a photosensitive recording medium through an original on an original holder, can be retracted out of a light path of an optional exposure unit to allow the optional exposure unit to apply light to the photosensitive recording medium through another original.

According to the present invention, there is provided an exposure system for an image recording apparatus in which a photosensitive and pressure-sensitive recording medium sensitive to a light in a predetermined wavelength range is exposed to the light irradiated from a light source disposed on one side of the photosensitive and pressure-sensitive recording medium. The light source applies the light to the recording medium through a first original. A space is reserved on said one side for accommodating therein an optional exposure unit for optionally exposing the recording medium through a second original.

The light source is movable while applying the light to the photosensitive and pressure-sensitive recording medium through the first original. The exposure system is further provided with a rest position for resting the light source out of a light path along which the optional exposure unit exposes the photosensitive and pressure-sensitive recording medium through the second original.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Preferred embodiments of the present invention will now be described with reference to the accompanying drawings.

In an exposure system of the present invention, it is intended to use a color reproducible photosensitive recording medium as disclosed in U.S. Pat. No. 4,399,209 to Sanders et al. The recording medium disclosed therein is of a so-called transfer type which is made up of a photosensitive and pressure-sensitive recording sheet and a developer sheet. The photosensitive and pressure-sensitive recording sheet is made up of a transparent base member made of resin and pressure rupturable microcapsules coated on one surface of the base member, each of the microcapsules separately containing photo-curable (or photo-softening) resin and one of primary color chromogenic materials or dye precursours, i.e. colors of cyan, magenta and yellow. A latent image can be formed on the photosensitive and pressure-sensitive recording sheet, since the microcapsule is sensitive to light in a predetermined wavelength range and a mechanical strength thereof varies when exposed to light. By pressure-rutpuring the uncured microcapsules and having the chromogenic material released from the microcapsule react with the developer material on the developer sheet, a visible image is formed on the developer sheet. Although the above-described recording medium is intended to be used in the exposure system of the present invention, photosensitive recording mediums of other types may also be employed in the exposure system.

Figure 1:
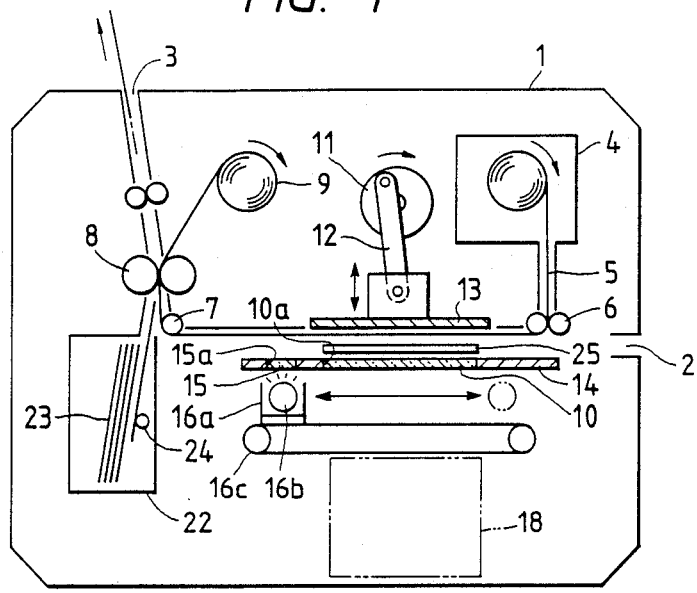
FIG. 1 is a schematic vertical cross-sectional view of an image recording apparatus incorporating an exposure system according to the present invention.

As shown in FIG. 1, an image recording apparatus 1 which incorporates an exposure system according to the present invention has an original insertion portion 2 provided in a righthand side panel and a sheet discharge portion 3 provided in the left side of an upper panel. A cassette 4 is disposed in the image recording apparatus in its righthand upper portion for housing a roll of a photosensitive and pressure-sensitive recording sheet 5. A pair of drive rollers 6 is positioned below the cassette 4 for withdrawing the photosensitive and pressure-sensitive recording sheet 5 from the cassette 4. A feed roller 7 is disposed leftwardly of the drive rollers 6 in horizontally spaced relation, and a pair of pressure developing rollers 8 is located above the feed roller 7. A takeup roll 9 is disposed upwardly of the pressure developing rollers 8 for winding the photosensitive and pressure-sensitive recording sheet 5. The photosensitive and pressure-sensitive recording sheet 5 is therefore supplied from the cassette 4 by the drive rollers 6 and then travels horizontally from the drive rollers 6 to the feed roller 7. The sheet 5 then passes between the pressure developing rollers 8 and is wound around the takeup roll 9.

A mechanism is disposed above the photosensitive and pressure-sensitive recording sheet 5 stretched between the rollers 6 and 7 for bringing the sheet 5 into intimate contact with an original holder glass plate 10 positioned below the sheet 5. The mechanism comprises a drive gear 11 rotatable by a motor, a connecting rod 12 having its upper end rotatably secured to an eccentric position of the drive gear 11, and a pressing plate 13 attached to the lower end of the connecting rod 12. In accordance with rotation of the drive gear 11, the pressing plate 13 is lowered by the connecting rod 12 to press the photosensitive and pressure-sensitive recording sheet 5 against the original holder glass plate 10. An original table or holder 14 positioned below the photosensitive and pressure-sensitive recording sheet 5 has slots or openings 10a, 15a in which the glass plate 10 and a glass plate 15 are fitted, respectively. A light source unit 16a housing a light source 16b such as a fluorescent lamp is horizontally movably supported by an endless belt 16c disposed below the original holder 14 for linear exposure of the photosensitive and pressure-sensitive recording sheet 5. The light source unit 16a is normally positioned in a storage area directly below the glass plate 15 fitted in the slot 15a.

Below the endless belt 16c, a space 18 is reserved for accommodating an optional exposure unit 17 (see FIG. 2). The optional exposure unit 17 comprises a projection lens 19 and an optional light source 21 for emitting light through an original 20 toward the projection lens 19.

A cassette 22 for storing a stack of color developer sheets 23 is disposed leftwardly of the original holder 14, the endless belt 16c, and the optional exposure unit 17. A feed foller 24 is disposed in the cassette 22 for feeding a color developer sheet 23 one by one toward the pressure developing rollers 8.

Operation of the image recording apparatus 1, particularly the exposure system disposed therein, will be described with reference to FIGS. 1 and 2.

Figure 2:
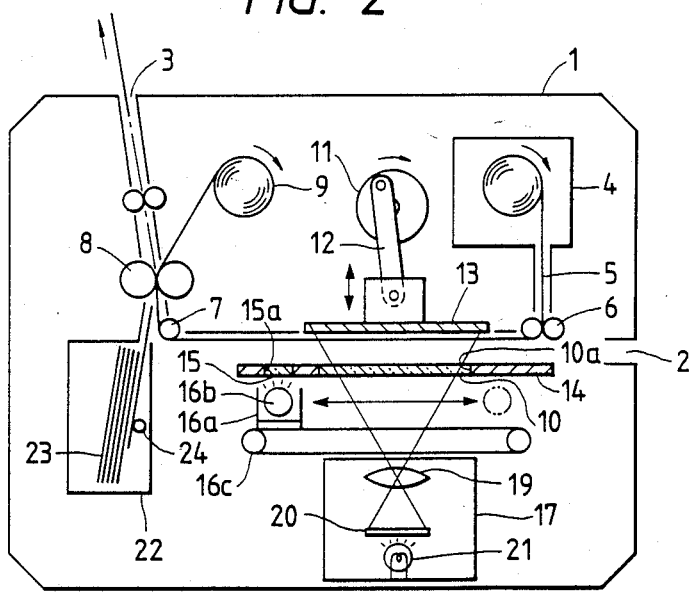
FIG. 2 is a schematic vertical cross-sectional view of an image recording apparatus incorporating an exposure system according to a first embodiment of the present invention.

As shown in FIG. 2, the optional exposure unit 17 is installed in the space 18. The original 20 is inserted into the optional exposure unit 17, and then the light source 21 is energized to emit light. The light emitted from the light source 21 passes through the original 20 and enters the projection lens 19. At this time, the light source unit 16a is positioned immediately below the glass plate 15 at the lefthand end of the original holder 14, offset from the light path of the optional exposure unitr 17.

The drive gear 11 is rotated by the motor to lower the pressing plate 13 to press the photosensitive and pressure-sensitive recording sheet 5 against the original holder glass plate 10, whereupon the photosensitive and pressure-sensitive recording sheet 5 starts being exposed to the light from the projection lens 19 which focuses the image of the original 20 onto the photosensitive and pressure-sensitive recording sheet 5. After the exposure, the drive gear 11 is rotated reversely to elevate the pressing plate 13 and release the photosensitive and pressure-sensitive recording sheet 5. The sheet 5 is then fed by the feed roller 7 so as to be wound up by the takeup roll 9.

Figure 4:
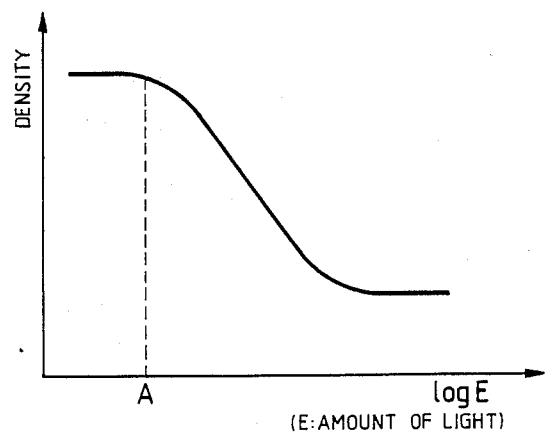
FIG. 4 is a graph showing a characteristic curve of a photosensitive and pressure-sensitive recording sheet.

While the photosensitive and pressure-sensitive recording sheet 5 is being thus fed along, the light source 16b is energized to subsequently expose the sheet 5 through the glass plate 15 for an interval of time dependent on the speed of travel of the sheet 5. As shown in FIG. 4, the photosensitive and pressure-sensitive recording sheet 5 has a density characteristic curve which indicates that the image density on the sheet 5 remains substantially unchanged even if the sheet 5 is exposed up to an amount of light indicated by A on a log E scale. The photosensitive and pressure-sensitive recording sheet 5 is uniformly exposed to such an amount of light by the light source 16b. It is known that the second exposure of the sheet 5 by the light source 16b gives rise to gradation on the sheet 5.

If the optional exposure unit 17 is not installed in the image recording apparatus 1, an original 25 is placed on the original holder 14 as shown in FIG. 1, and the pressing plate 13 is lowered to press the original 25 against the glass plate 10. The light source unit 16a is horizontally moved to the rightward direction by the endless belt 16c while being energized to emit light. The light having passed through the original 25 is exposed to the photosensitive and pressure-sensitive recording sheet 5 in a linear exposure mode. Thereafter, the pressing plate 13 is lifted, and the light source unit 16a is moved back to the lefthand position wherein it is energized again to expose the sheet 5 through the glass plate 15 for the second exposure.

When an exposed area of the photosensitive and pressure-sensitive recording sheet 5 is fed past the glass plate 15, the light source 16b is de-energized. When the exposed area of the sheet 5 moves past the feed roller 7 and reaches the pressure developing rollers 8, a color developer sheet 23 is delivered from the cassette 22 into superposed relation to the exposed area of the sheet 5. The sheets 5 and 23 are then pressed together by the rollers 8 to transfer an image from the sheet 5 to the sheet 23 while developing a latent image into a visible image. Thereafter, the photosensitive and pressure-sensitive recording sheet 5 is separated from the color developer sheet 23 and wound up by the takeup roll 9. The color developer sheet 23 with the developed image thereon is then discharged from the sheet discharge portion 3.

Figure 3:
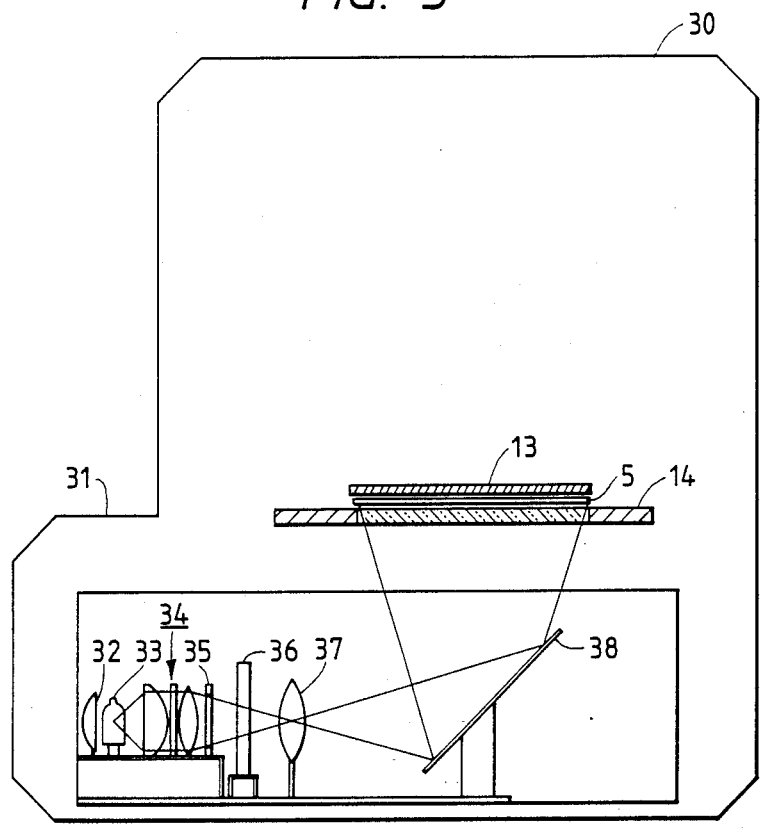
FIG. 3 is a schematic vertical cross-sectional view of an exposure system according to a second embodiment of the present invention.

An exposure system according to another embodiment of the present invention will be described with reference to FIG. 3. The exposure system, generally designated by reference numeral 30, includes an optional exposure unit 31. The optional exposure unit 31 includes a halogen lamp 33 as a light source for emitting light, a condenser lens unit 34 for converging the light, a color revision filter 36, a main lens 37 and a mirror 38. The optional exposure unit 31 further includes a spherical shaped reflection mirror 32 for reflecting and converging the backwardly directed light. The optional exposure unit 31 is housed in a space below the original table 14 in the exposure system 30. The original 33, which may be 35 mm slide, can freely be inserted into and removed from the optional exposure unit 31, so that the original 33 can be replaced with another original. The original 35 is inserted into a position between the condenser lens unit 34 and the color revision filter 36. The image of the original 35 irradiated by the halogen lamp 33 is focussed onto the photosensitive and pressure-sensitive recording sheet 5 by the main lens 37 and the mirror 37. The exposure system 30 may be associated with the other structures of the image recording apparatus 1 shown in FIG. 1.

In FIG. 1, the slot 15a and the glass plate 15 fitted therein may be dispensed with, and the second exposure cycle through the glass plate 15 may not be carried out.

With the arrangement of the present invention, as described above, the exposure system has the space 18 for accommodating the optional exposure unit 18 and 31, and the light path from the light source 16b toward the photosensitive and pressure-sensitive recording sheet 5 is also used by the optional exposure unit 17. Accordingly, the exposure system is reduced in size. Moreover, when the light source unit 16b is not used for illuminating the original 25, the light source unit 16b is retracted into the rest area offset from the light path of the optional exposure unit 17. Therefore, the light source unit 16b in the rest area does not present any obstacle to the exposure of the photosensitive and pressure-sensitive recording sheet 5 by the optional exposure unit 17.

Although certain preferred embodiments have been shown and described, it should be understood that many changes and modifications may be made therein without departing from the scope of the appended claims.

What is claimed is:

1. An exposure system for exposing a photosensitive recording medium to a light, comprising:
   first exposure means disposed on the same side of said photosensitive recording medium for applying light to said photosensitive recording medium; and
   second exposure means disposed on the same side of said photosensitive recording medium as the side on which said first exposure means is disposed for applying light to said photosensitive recording medium, wherein said first exposure means and said second exposure means selectively apply light to said photosensitive recording medium;
   wherein said first exposure means comprises a first light source movable along said photosensitive recording medium, said first light source applying the light of said first exposure means to said photosensitive recording medium through a first original, and said second exposure means comprises a second light source, said second light source applying the light of said second exposure means to said photosensitive recording medium through a second original, wherein when said second exposure means is applying the light to said photosensitive recording medium, said first exposure means is disposed in a position offset from a path of the light that said first light source applies to said photosensitive recording medium.

2. An exposure system as claimed in claim 1, wherein said second exposure means is disposed in a stationary position to confront said photosensitive recording medium.

3. An exposure system as claimed in claim 2, wherein said second exposure means is detachably provided.

4. An exposure system as claimed in claim 3, wherein said second exposure means further comprises a projection lens, said projection lens receiving the light passed through said second original and projecting the light onto said photosensitive recording medium.

5. An exposure system as claimed in claim 3, wherein said second exposure means further comprises a projection lens, said projection lens receiving the light passed through said second original, and a mirror for reflecting the light from said projection lens and directing the reflected light toward said photosensitive recording medium.

6. An exposure system as claimed in claim 1, wherein said photosensitive recording medium is further sensitive to pressure.

7. An exposure system as claimed in claim 6, wherein said photosensitive and pressure-sensitive recording medium is formed with a latent image when exposed to the light and said latent image is developed to be a visible image when pressure is applied.

* * * * *